(12) United States Patent
Seibold

(10) Patent No.: US 7,649,379 B2
(45) Date of Patent: Jan. 19, 2010

(54) REDUCING MISSION SIGNAL OUTPUT DELAY IN IC HAVING MISSION AND TEST MODES

(75) Inventor: John Joseph Seibold, Frisco, TX (US)

(73) Assignee: Texas Instruments Incorporated, Dallas, TX (US)

( * ) Notice: Subject to any disclaimer, the term of this patent is extended or adjusted under 35 U.S.C. 154(b) by 208 days.

(21) Appl. No.: 11/964,323

(22) Filed: Dec. 26, 2007

(65) Prior Publication Data

US 2009/0171611 A1 Jul. 2, 2009

(51) Int. Cl.
*H03K 19/00* (2006.01)
(52) U.S. Cl. .......................................... 326/16; 714/724
(58) Field of Classification Search .................. 326/16, 326/37, 38, 46; 714/724–727
See application file for complete search history.

(56) References Cited

U.S. PATENT DOCUMENTS

| | | | | |
|---|---|---|---|---|
| 5,392,296 A | * | 2/1995 | Suzuki | 714/731 |
| 6,199,182 B1 | * | 3/2001 | Whetsel | 714/724 |
| 7,428,676 B2 | * | 9/2008 | Kashiwagi | 714/727 |

* cited by examiner

*Primary Examiner*—Don P Le
(74) *Attorney, Agent, or Firm*—Dawn V. Stephens; Wade James Brady, III; Frederick J. Telecky, Jr.

(57) ABSTRACT

An integrated circuit apparatus includes a switching circuit that provides respective signal paths to permit a mission signal, a test signal, and a boundary scan test signal to share an output terminal. The signal path associated with the mission signal imposes a smaller switching delay than do the signal paths associated with the test and boundary scan test signals.

20 Claims, 2 Drawing Sheets

US 7,649,379 B2

REDUCING MISSION SIGNAL OUTPUT DELAY IN IC HAVING MISSION AND TEST MODES

FIELD OF THE INVENTION

The invention relates generally to integrated circuits and, more particularly, to integrated circuits that can selectively assume either a mission mode of operation or a test mode of operation.

BACKGROUND OF THE INVENTION

It is well known that integrated circuits, for example, microprocessors, digital signal processors (DSPs), application specific integrated circuits (ASICs), etc. are often capable of operation in both mission and test modes. In mission mode, mission circuitry in the integrated circuit performs mission functions that the integrated circuit is intended to perform when deployed in the field. In a test mode, test circuitry in the integrated circuit performs test functions, for example, testing the physical integrity and/or functional performance of the mission circuitry. Such test functions can be performed during the integrated circuit manufacturing process, such as wafer probe testing of integrated circuits at the wafer level, or testing of the final packaged die. Test functions can also be performed after deployment of the integrated circuit, such as built-in-system-test (BIST). Integrated circuits are also commonly provided with boundary scan test functionality that permits controlling and/or capturing inputs and outputs of the mission circuitry for test purposes. The types of mission mode and test mode operations described above are well known in the art.

FIG. 1 diagrammatically illustrates a conventional integrated circuit apparatus having mission functionality and test functionality. The integrated circuit apparatus of FIG. 1 includes a boundary scan register (BSR) 15 for scanning test signals between externally accessible boundary scan input (BSI) and boundary scan output (BSO) terminals of the integrated circuit apparatus. As is well known in the art, the BSR 15 permits test signals (used in a test mode of operation) to be scanned into the integrated circuit apparatus from an external test apparatus, and/or to be captured from the integrated circuit apparatus and then scanned out to an external test apparatus. As shown in FIG. 1, mission signals (designated generally at 14) produced by mission circuitry 11 can be captured into BSR 15 and then scanned out via the BSO terminal. The mission signals 14 are also input to respective ones of a plurality of switching circuits designated collectively at 17. Boundary scan test signals (designated generally at 12) from the BSR 15 are also input to respective ones of the switching circuits 17. Furthermore, test signals (designated generally at 16) produced by test circuitry 13 are input to respective ones of the switching circuits 17. The test circuitry 13 provides the test signals 16 as a result of a testing operation (e.g., manufacturing test, BIST, etc.) that the test circuitry 13 applies to the mission circuitry independently of terminal BSI, terminal BSO, and BSR 15. The switching circuits 17 provide respective output signals (designated collectively at 18) to respective ones of a plurality of output circuits designated collectively at 19.

Each of the of the output circuits 19 drives a corresponding output signal of the integrated circuit apparatus from an output terminal (not explicitly shown) of the integrated circuit apparatus to a destination that is external to the integrated circuit apparatus. Any one or more of the signals at 18, as output from the switching circuits at 17, can be either the actual integrated circuit output signal intended for an external destination, or a control signal that controls the associated output circuit at 19 for driving the actual integrated circuit output signal (shown by broken line at 10) to the external destination. Examples of control signals at 18 include an output enable signal, and an input/output control signal (such as associated with a bidirectional terminal).

FIG. 2 diagrammatically illustrates one of the switching circuits shown at 17 in FIG. 1, designated as 17A in FIG. 2. The switching circuit 17A outputs a corresponding one of the signals shown at 18 in FIG. 1, designated as 18A in FIG. 2. This switching circuit output signal 18A is input to a corresponding one of the output circuits shown at 19 in FIG. 1, designated as 19A in FIG. 2. FIG. 2 also illustrates the aforementioned situation where the signal 18A is a an output control signal that controls the driving of the actual signal (i.e., one of the signals shown at 10 in FIG. 1, designated as 10A in FIG. 2) that is to be output to an external destination.

The switching circuit 17A includes first and second selectors 21 and 23 that are respectively controlled by external control signals TM and MODE provided via externally accessible input terminals of the integrated circuit apparatus. One input of the selector 21 receives one of the test signals 16 (designated as test signal 16A in FIG. 2) from the test circuitry 13 of FIG. 1. The other input of selector 21 receives one of the mission signals 14 (designated as mission signal 14A in FIG. 2) from the mission circuitry 13 of FIG. 1. The output 22 of the selector 21 is coupled to one input of the selector 23. The other input of the selector 23 receives one of the boundary scan test signals 12 (designated as boundary scan test signal 12A in FIG. 2) from the BSR 15 of FIG. 1. Under appropriate control of TM and MODE, the switching circuit 17A routes a selected one of the signals 12A, 14A and 16A to the output circuit 19A. Thus, the switching circuit 17A provides signal paths that permit the BSR 15, mission circuitry 11, and test circuitry 13 to share the output circuit 19A. Each of the switching circuits at 17 in FIG. 1 is the same as the switching circuit 17A of FIG. 2, and routes a corresponding set of mission (see 14), test (see 16) and boundary scan test (see 12) signals to a corresponding output circuit (see 19).

It can be seen from the foregoing that the above-described prior art approach for providing test mode capabilities in an integrated circuit apparatus incurs a time delay cost. More specifically, each mission signal (e.g., mission signal 14A of FIG. 2) must traverse a switching delay imposed by the associated switching circuit 17 (e.g., switching circuit 17A of FIG. 2).

It is therefore desirable to provide test mode capabilities in an integrated circuit apparatus without the associated time delay cost incurred in the above-described prior art approach.

DETAILED DESCRIPTION

Figure 2:
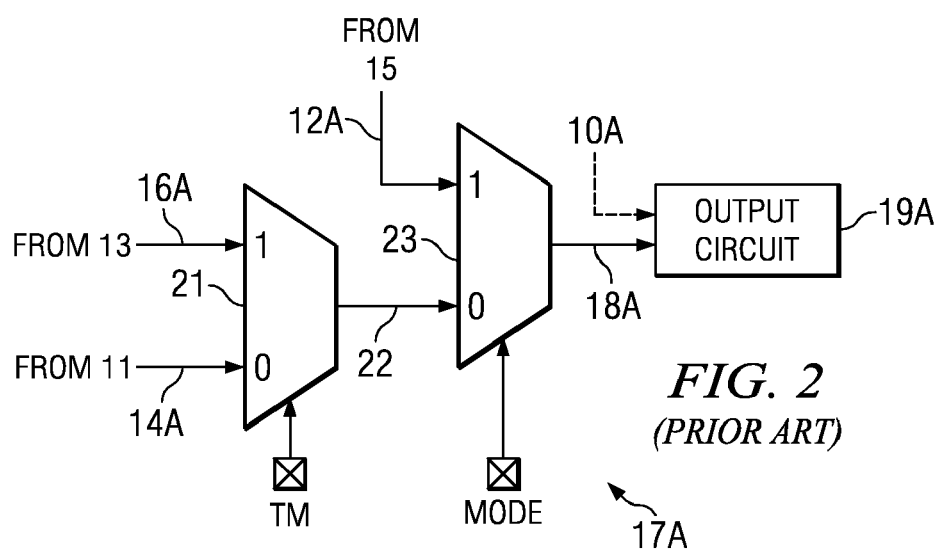
FIG. 2 diagrammatically illustrates a switching circuit of FIG. 1.
Figure 3:
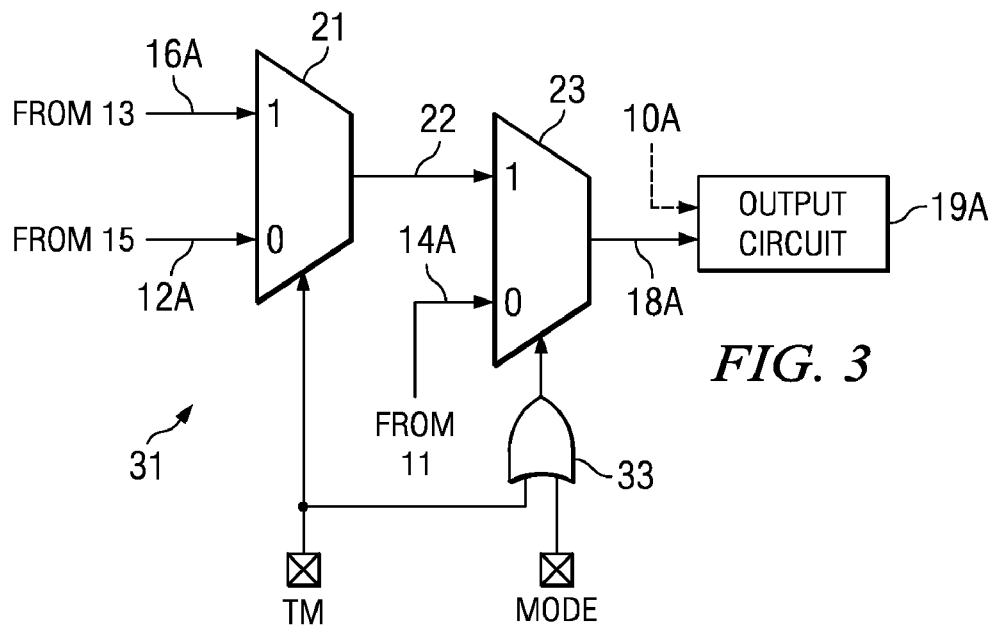
FIG. 3 diagrammatically illustrates a switching circuit according to exemplary embodiments of the invention.

FIG. 3 diagrammatically illustrates an integrated circuit apparatus having mission mode and test mode capabilities according to exemplary embodiments of the invention. FIG. 3 diagrammatically illustrates a switching circuit 31 that according to exemplary embodiments of the invention. In the switching circuit 31, the test signal 16A and the boundary scan test signal 12A (see also FIG. 2) are respectively applied to the inputs of the selector 21, and the mission signal 14A is applied to one input of the selector 23. The output 22 of the selector 21 is coupled to the other input of the selector 23. The signal TM controls the selector 21 as in FIG. 2, and the selector 23 is controlled by the output of an OR gate 33 whose inputs are TM and MODE (see also FIG. 2). When TM is logic low, the switching circuit 31 routes either the boundary scan test signal 12A or the mission signal 14A to the output circuit 19A, depending on the level of MODE. When TM is logic high, the switching circuit routes the test signal 16A to the output circuit 19A. Thus, the switching circuit 31 provides signal paths that permit the BSR 15, mission circuitry 11, and test circuitry 13 to share the output circuit 19A.

The signal path for the mission signal 14A in FIG. 3 traverses only the selector 23, and thus imposes only the switching delay associated with selector 21. The signal path for the boundary scan test signal 12A traverses both selectors 21 and 23, and thus imposes the switching delay associated with selector 21 and the switching delay associated with selector 23. The signal path for the test signal 16A also traverses both selectors 21 and 23, and thus imposes the switching delay associated with selector 21 and the switching delay associated with selector 23. In some embodiments, each of the selectors 21 and 23 is implemented as a 2-to-1 multiplexer.

Because the control signal TM participates in the routing of the boundary scan test signal 12A, the externally accessible terminal associated with TM should not be accessible via boundary scan operation. In some embodiments, the TM terminal is maintained isolated from terminal BSI, terminal BSO, and BSR 15. In some embodiments, the TM terminal is tied to logic low when the integrated circuit apparatus is deployed in its intended mission environment.

Figure 1:
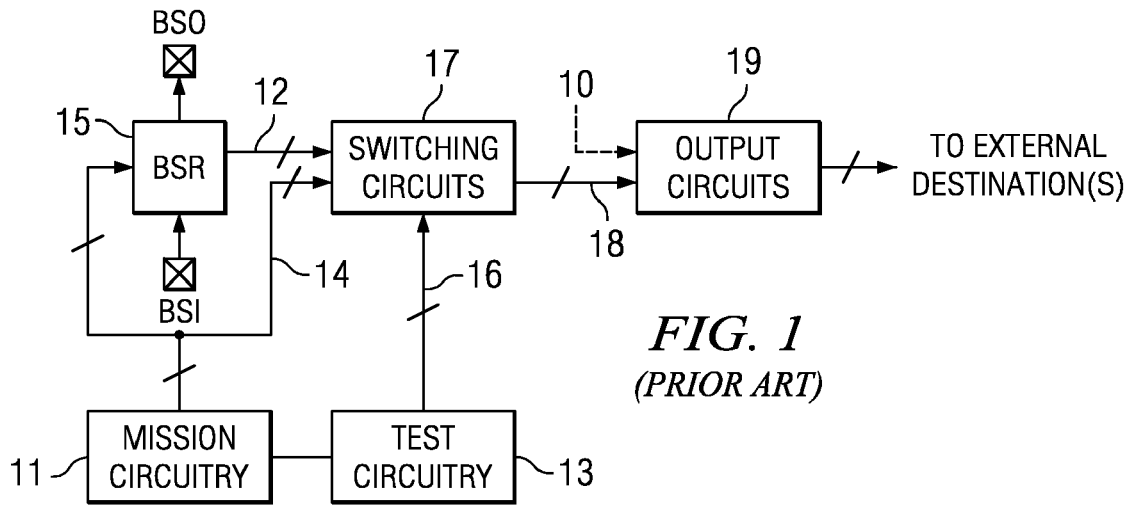
FIG. 1 diagrammatically illustrates an integrated circuit apparatus having mission mode and test mode capabilities according to the prior art.
Figure 4:
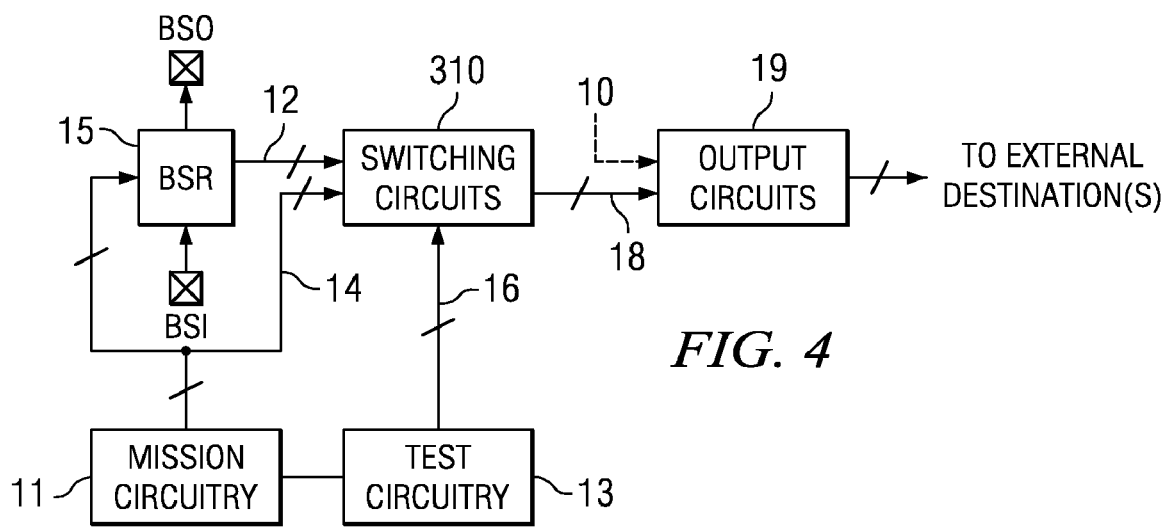
FIG. 4 diagrammatically illustrates an integrated circuit apparatus having mission mode and test mode capabilities according to exemplary embodiments of the invention.

FIG. 4 diagrammatically illustrates an integrated circuit apparatus having mission mode and test mode capabilities according to exemplary embodiments of the invention. The apparatus of FIG. 4 contains a plurality of the switching circuits 31 of FIG. 3. These switching circuits are shown collectively at 310. Each of the switching circuits 31 (shown collectively at 310 in FIG. 4) routes a corresponding set of mission (see 14), test (see 16), and boundary scan test (see 12) signals to a corresponding output circuit (see 19). All of the switching circuits are controlled in parallel via the TM terminal and the MODE terminal, in the manner described above with respect to FIG. 3. In some embodiments, the remainder of the integrated circuit apparatus of FIG. 4 is the same as described above with respect to FIG. 1.

Although exemplary embodiments of the invention have been described above in detail, this does not limit the scope of the invention, which can be practiced in a variety of embodiments.

What is claimed is:

1. An integrated circuit apparatus having mission functionality and testing functionality, comprising:
    mission circuitry that implements said mission functionality;
    an output circuit for outputting signals to an external destination apparatus;
    a scan register for scanning test data into the integrated circuit apparatus;
    a test terminal coupled to said scan register for transferring test data serially between said scan register and an external test apparatus;
    test circuitry coupled to said mission circuitry for testing said mission circuitry independently of said test terminal and said scan register;
    a first selector having a first input coupled to said scan register, a second input coupled to said test circuitry, and an output; and
    a second selector having a first input coupled to said mission circuitry, a second input coupled to said output of said first selector, and an output coupled to said output circuit.

2. The apparatus of claim 1, wherein said first selector is coupled to receive a first control signal, and said second selector is coupled to receive a second control signal, and including control signal logic coupled to receive said first control signal and configured to produce said second control signal based on said first control signal.

3. The apparatus of claim 2, wherein said control signal logic includes a combinational logic circuit for combining said first control signal with a third control signal to produce said second control signal.

4. The apparatus of claim 2, including an input terminal for receiving said first control signal from an external source.

5. The apparatus of claim 4, wherein said input terminal is isolated from said scan register and said test terminal.

6. The apparatus of claim 1, including a plurality of said output circuits, a plurality of said first selectors, and a plurality of said second selectors, said second inputs of said second selectors respectively coupled to said outputs of said first selectors, and said outputs of said second selectors respectively coupled to said output circuits.

7. The apparatus of claim 1, wherein said output circuit has a signal input for receiving signals to be output from the integrated circuit apparatus to an external destination, and wherein said output of said second selector is coupled to said signal input.

8. The apparatus of claim 1, wherein said output circuit has a control input for receiving a control signal that controls operation of said output circuit, and wherein said output of said second selector is coupled to said control input.

9. The apparatus of claim 8, wherein said control signal is an enable signal.

10. The apparatus of claim 8, wherein said control signal is an input/output control signal.

11. An integrated circuit apparatus having mission functionality and testing functionality, comprising:
    mission circuitry that implements said mission functionality;
    an output circuit for outputting signals to an external destination apparatus;
    a scan register for scanning test data into the integrated circuit apparatus;
    a test terminal coupled to said scan register for transferring test data serially between said scan register and an external test apparatus;
    test circuitry coupled to said mission circuitry for testing said mission circuitry independently of said test terminal and said scan register; and
    a switching circuit that couples said output circuit to said scan register, said test circuitry and said mission circuitry, said switching circuit providing a first signal path that couples said scan register to said output circuit and imposes a first switching delay, a second signal path that couples said test logic to said output circuit and imposes a second switching delay, and a third signal path that couples said mission circuitry to said output circuit and imposes a third switching delay, wherein said third switching delay is smaller than said first switching delay and said second switching delay.

12. The apparatus of claim 11, wherein said switching circuit includes first and second selectors coupled in series in said first signal path, said first and second selectors also coupled in series in said second signal path, and said second selector also coupled in said third signal path.

13. The apparatus of claim 12, wherein said first selector is coupled to receive a first control signal, and said second selector is coupled to receive a second control signal, and including control signal logic coupled to receive said first control signal and configured to produce said second control signal based on said first control signal.

14. The apparatus of claim 13, wherein said control signal logic includes a combinational logic circuit for combining said first control signal with a third control signal to produce said second control signal.

15. The apparatus of claim 13, including an input terminal for receiving said first control signal from an external source.

16. The apparatus of claim 15, wherein said input terminal is isolated from said scan register and said test terminal.

17. The apparatus of claim 11, including a plurality of said output circuits and a plurality of said switching circuits that respectively couple said output circuits to each of said scan register, said test circuitry and said mission circuitry.

18. The apparatus of claim 11, wherein said output circuit has a signal input for receiving signals to be output from the integrated circuit apparatus to an external destination, and wherein said first, second and third signal paths are coupled to said signal input.

19. The apparatus of claim 11, wherein said output circuit has a control input for receiving a control signal that controls operation of said output circuit, and wherein said first, second and third signal paths are coupled to said control input.

20. The apparatus of claim 19, wherein said control signal is one of an enable signal and an input/output control signal.

* * * * *